(12) United States Patent
Saitou (10) Patent No.: US 9,686,876 B2
(45) Date of Patent: Jun. 20, 2017

(54) DISPLAY FOR CONSTRUCTION MACHINE AND CONSTRUCTION MACHINE

(71) Applicant: KOMATSU LTD., Minato-ku, Tokyo (JP)

(72) Inventor: Tomohiro Saitou, Kanagawa (JP)

(73) Assignee: KOMATSU LTD., Tokyo (JP)

( * ) Notice: Subject to any disclaimer, the term of this patent is extended or adjusted under 35 U.S.C. 154(b) by 0 days.

(21) Appl. No.: 14/403,944

(22) PCT Filed: Dec. 11, 2013

(86) PCT No.: PCT/JP2013/083222
§ 371 (c)(1),
(2) Date: Nov. 25, 2014

(87) PCT Pub. No.: WO2014/167753
PCT Pub. Date: Oct. 16, 2014

(65) Prior Publication Data
US 2015/0103287 A1    Apr. 16, 2015

(30) Foreign Application Priority Data

Apr. 11, 2013  (JP) ................................. 2013-082985

(51) Int. Cl.
*G02F 1/1333*  (2006.01)
*H05K 5/02*  (2006.01)
(Continued)

(52) U.S. Cl.
CPC ............ *H05K 5/0204* (2013.01); *B60R 11/02* (2013.01); *E02F 9/00* (2013.01); *E02F 9/0858* (2013.01);
(Continued)

(58) Field of Classification Search
CPC .. G02F 1/133308; G02F 2001/133314; H05K 5/0204
(Continued)

(56) References Cited

U.S. PATENT DOCUMENTS

2001/0033009 A1* 10/2001 Inoue ................. H05K 7/20963
257/668
2002/0003571 A1* 1/2002 Schofield ................ B60C 23/00
348/148
(Continued)

FOREIGN PATENT DOCUMENTS

CN    1621628 A    6/2005
CN    102079275 A    6/2011
(Continued)

OTHER PUBLICATIONS

International Preliminary Report on Patentability (IPRP) including Written Opinion (in English) dated Oct. 13, 2015, issued in parent International Application No. PCT/JP2013/083222.
(Continued)

*Primary Examiner* — Paul Lee
*Assistant Examiner* — Jia Pan
(74) *Attorney, Agent, or Firm* — Holtz, Holtz & Volek PC (57) ABSTRACT

A display for a construction machine includes: a metal case that is detachably supported on a construction machine frame via a universal joint (a joint member); a liquid crystal display (a display unit) that is attached to the metal case; and a control board that is attached to the metal case and is configured to perform a display control on the liquid crystal display.

6 Claims, 10 Drawing Sheets

(51) Int. Cl.
| | |
|---|---|
| *H05K 7/20* | (2006.01) |
| *E02F 9/00* | (2006.01) |
| *E02F 9/26* | (2006.01) |
| *E02F 3/00* | (2006.01) |
| *E02F 5/00* | (2006.01) |
| *B60R 11/02* | (2006.01) |
| *E02F 9/08* | (2006.01) |
| *B60R 11/00* | (2006.01) |

(52) U.S. Cl.
CPC ............ *E02F 9/26* (2013.01); *H05K 7/2039* (2013.01); *B60R 2011/0078* (2013.01); *B60R 2011/0089* (2013.01); *E02F 3/00* (2013.01); *E02F 5/00* (2013.01); *G02F 1/133308* (2013.01); *G02F 2001/133314* (2013.01)

(58) Field of Classification Search
USPC ...................................................... 349/58–60
See application file for complete search history.

(56) References Cited

U.S. PATENT DOCUMENTS

| | | | | |
|---|---|---|---|---|
| 2007/0164873 | A1* | 7/2007 | Yamada | E02F 9/26 340/679 |
| 2011/0006091 | A1* | 1/2011 | Schafer | B60R 11/00 224/282 |
| 2012/0086882 | A1* | 4/2012 | Itoh | G02F 1/1336 349/58 |
| 2013/0176120 | A1* | 7/2013 | Shibamori | E02F 9/267 340/438 |
| 2014/0009716 | A1* | 1/2014 | Tang | G02F 1/133608 349/58 |

FOREIGN PATENT DOCUMENTS

| | | |
|---|---|---|
| JP | 2002160586 A | 6/2002 |
| JP | 2005035426 A | 2/2005 |
| JP | 2005084270 A | 3/2005 |
| JP | 3685955 B2 | 8/2005 |
| JP | 2011132800 A | 7/2011 |
| JP | 2013015608 A | 1/2013 |

OTHER PUBLICATIONS

Japanese Office Action (and English translation thereof) dated Jun. 2, 2015, issued in counterpart Japanese Application No. 2013-082985.

International Search Report (ISR) dated Mar. 18, 2014 issued in International Application No. PCT/JP2013/083222.

Chinese Office Action (and English translation thereof) dated Jan. 12, 2016, issued in counterpart Chinese Application No. 201380022300.3.

* cited by examiner

DISPLAY FOR CONSTRUCTION MACHINE AND CONSTRUCTION MACHINE

TECHNICAL FIELD

The present invention relates to a display for a construction machine and a construction machine. In particular, the present invention relates to a display usable in a construction machine provided with a computerized construction system and to a construction machine provided with the display.

BACKGROUND ART

Typically known displays usable in working vehicles such as construction machines include a display mounted on a holder in a cab in which an operator is seated (see, for instance, Patent Literature 1). Such a display shows, for instance, the progress of work performed by a construction machine and the conditions of various devices.

These days, computerized construction has been rapidly getting widespread, for instance, in the field of civil engineering work using a construction machine. Computerized construction is applied to construction work such as civil engineering work performed using a construction machine such as a hydraulic excavator, a bulldozer and a motor grader. Specifically, in computerized construction, the position of the working equipment of the construction machine is detected using an information and communication technology (ICT) to, for instance, automatically control the working equipment based on the detected position and/or show on a display in a cab information including the topography of a construction site and a position of the working equipment relative to the topography of the construction site in order to perform the construction work (hereinafter, simply referred to as "work") with high efficiency and achieve a highly accurate construction result.

CITATION LIST

Patent Literature(s)

Patent Literature 1: JP-A-2005-35426

SUMMARY OF THE INVENTION

Problem(s) to be Solved by the Invention

When computerized construction is applied, a lot of information needs to be shown to an operator, so that a display disclosed by Patent Literature 1 itself is not adequate to sufficiently and timely show necessary information. Accordingly, in addition to such a display, another display for computerized construction is required. Further, the display for computerized construction should preferably be installed at a position where an operator seated on an operator's seat can easily look at during operation, such as a front side in a cab.

Additionally, since a lot of information is dealt with in computerized construction, a numerical operation, a graphic operation and the like need to be performed at a high speed and thus the display for computerized construction should preferably function as a computer. The display also needs to have a function that enables an operator to detach the display from the installation position in the cab so that, for instance, the display can be brought back to an administrative office in a construction site and necessary information can be uploaded to/downloaded from the display in a place away from the construction site. The necessary information includes information of daily construction progress, a preset value required for computerized construction, and a program for a graphic operation. Additionally, in order to ensure the visibility of the display irrespective of the height of an operator seated in a cab or operator's posture that may change during operation, the display should desirably be adjustable in position and direction.

Further, in, especially, a construction machine, the display is subjected to large vibration or impact caused during operation, so that properties required of the display include durability sufficient to reliably endure the large vibration or impact.

An object of the invention is to provide a display for a construction machine and a construction machine, the display ensuring high visibility and exhibiting high vibration resistance and impact resistance when installed in a construction machine as well as being easily attachable to/detachable from the construction machine and exhibiting high portability.

Means for Solving the Problem(s)

According to a first aspect of the invention, a display for a construction machine includes: a metal case that is detachably supported on a construction machine frame via a universal joint; a display unit that is attached to the metal case; and a control board that is attached to the metal case and is configured to perform a display control on the display unit.

In the above aspect, it is preferable that the display further include a resin case that is attached to the metal case to provide a rear case in combination with the metal case; and a resin front case that is attached to the rear case to define an inner housing space in which the display unit and the control board are housed.

In the above aspect, it is preferable that an electronic component mounted on the control board be in contact with the metal case via a heat radiator.

In the above aspect, it is preferable that the metal case include a plurality of ribs that radially extend from a portion of the metal case attached with the universal joint.

In the above aspect, it is preferable that the display unit be a liquid crystal display, and the liquid crystal display include: a liquid crystal module; and a metal frame that is configured to hold the liquid crystal module at least from a lateral side of the liquid crystal module.

According to a second aspect of the invention, a display for a construction machine, the construction machine being a hydraulic excavator, includes: a metal case that is detachably supported on a construction machine frame via a universal joint; a display unit that is attached to the metal case; a control board that is attached to the metal case and is configured to perform a display control on the display unit; a resin case that is attached to the metal case to provide a rear case in combination with the metal case; and a resin front case that is attached to the rear case to define an inner housing space in which the display unit and the control board are housed, in which the liquid crystal display includes: a liquid crystal module; and a metal frame that is configured to hold the liquid crystal module from a rear side, a lateral side and a front side of the liquid crystal module, and the liquid crystal display is located near an operator's seat of a hydraulic excavator.

According to a third aspect of the invention, a construction machine includes any one of the displays.

In the above aspect, the display is supported on a cab frame of a construction machine via a universal joint. Since the display is supported at a single point by the universal joint, the display is adjustable in position and direction and is easily attachable/detachable from the cab frame with less complications. Therefore, the display can be handled with improved convenience.

Further, the display unit and the control board of the display, which are heavy devices, are integrally attached to the metal case, which is excellent in strength and rigidity and is supported on the cab frame via the universal joint. Therefore, the display can be provided with high durability, so that, for instance, a connected portion between the universal joint and the display is not damaged by vibration or impact caused during the operation of the construction machine. In the above aspect, the display unit and the control board are also firmly fixed in the display, so that the display unit and the control board can be prevented from being damaged. Therefore, the display can be provided with high durability to exhibit excellent vibration resistance and impact resistance as a whole.

DESCRIPTION OF EMBODIMENT(S)

Schematic Description of Construction Machine

An exemplary embodiment of the invention will be described below with reference to the attached drawings.

Figure 1:
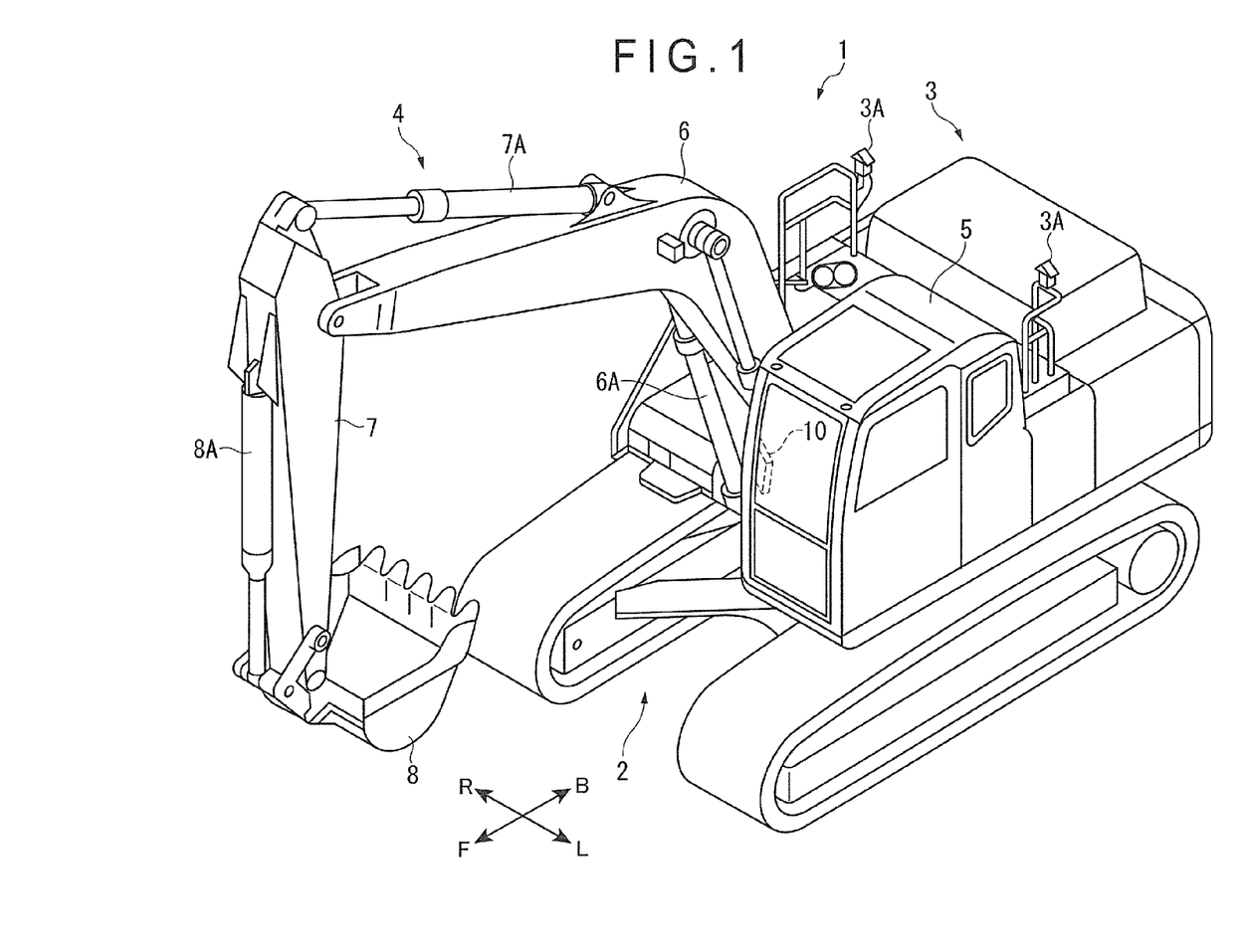
FIG. 1 is an overall perspective view showing a construction machine according to an exemplary embodiment of the invention.
Figure 2:
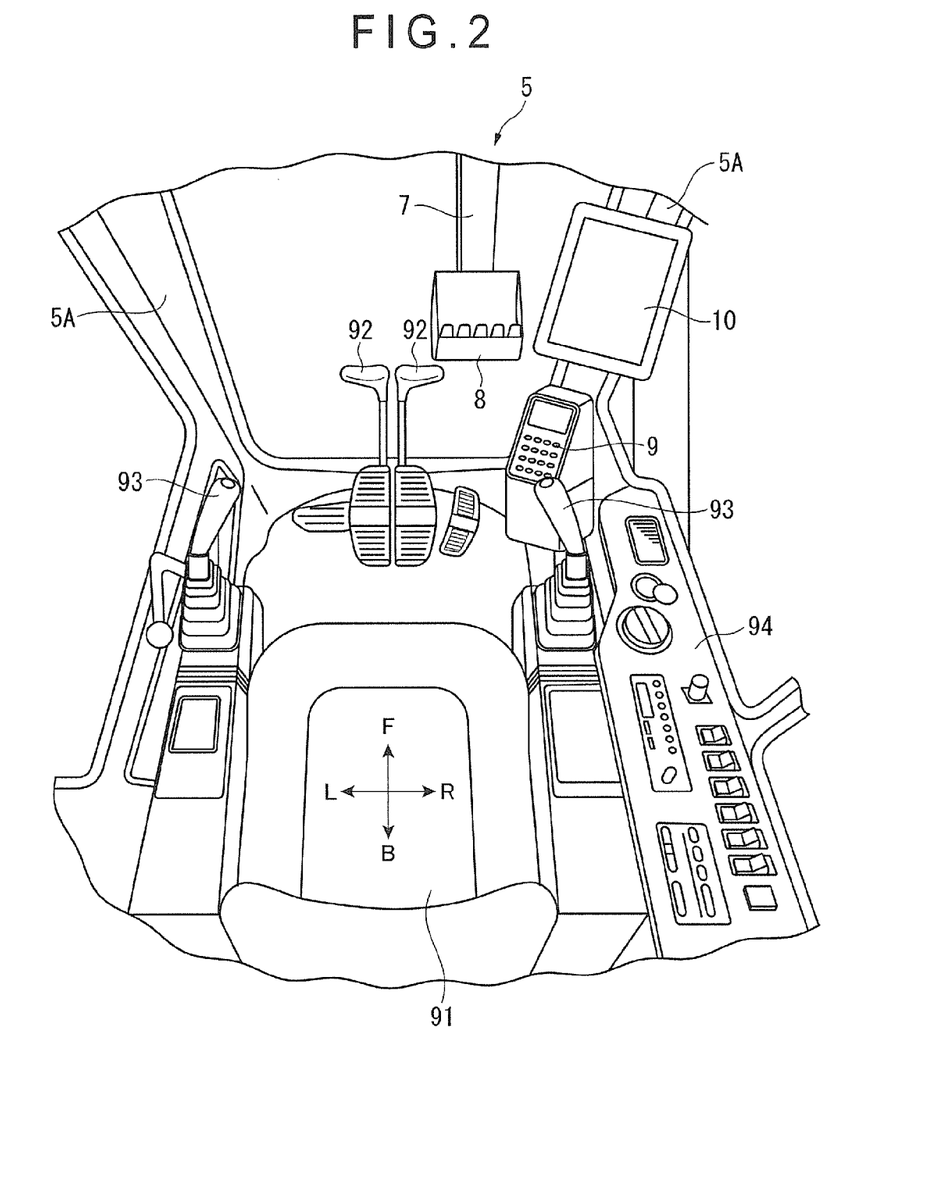
FIG. 2 shows an interior of a cab of the construction machine.

FIG. 1 is an overall perspective view showing a hydraulic excavator 1 as a construction machine according to the exemplary embodiment. FIG. 2 shows an interior of a cab 5 provided to the hydraulic excavator 1.

As shown in FIG. 1, the hydraulic excavator 1 mainly includes an undercarriage 2, an upper revolving body 3 and working equipment 4.

The undercarriage 2 includes a pair of right and left crawlers. The rotation of the pair of crawlers enables the hydraulic excavator 1 to turn or travel.

The upper revolving body 3 is rotatably mounted on the undercarriage 2. The cab 5, in which an operator is to be seated to operate the hydraulic excavator 1, is provided on a left side L and a front side F of the upper revolving body 3 (i.e., a front side of a vehicle). An engine compartment, in which an engine is housed, is provided on a rear side B of the upper revolving body 3 and a counter weight is provided on the rear side B of the engine compartment.

In the exemplary embodiment, it should be noted that left side L, right side R, front side F and rear side B respectively mean left, right, front and rear sides of an operator seated on operator's seat 91 (FIG. 2) in the cab 5.

The working equipment 4, which is used for earth excavation or the like, includes a boom 6 that is pivotally supported by the upper revolving body 3 on the right side R of the cab 5. Specifically, the working equipment 4 includes: the boom 6 attached to the upper revolving body 3 to be vertically swingable therearound; an arm 7 swingably attached to an end of the boom 6; and a bucket 8 swingably attached to an end of the arm 7. The boom 6, the arm 7 and the bucket 8 are respectively connected to ends of cylinder rods of a boom cylinder 6A, an arm cylinder 7A, a bucket cylinder 8A, which are hydraulic cylinders, so that the extension and retraction of the cylinder rods of these cylinders enable the swinging movement of the working equipment 4. Incidentally, the bucket 8 is connected to the bucket cylinder 8A via a linking member connected to the end of the cylinder rod of the bucket cylinder 8A.

Schematic Description of Computerized Construction System

In the exemplary embodiment, the hydraulic excavator 1 includes an arrangement that functions as a computerized construction system. The computerized construction system will be schematically described below. In the computerized construction system, construction design data created by a three-dimensional CAD (Computer Aided Design) is stored in a predetermined storage such as a memory. The storage is provided in a storage (not shown) provided to the hydraulic excavator 1 or is provided to a control board 14 of a display 10 (described later). In the exemplary embodiment, the display 10 (described later) shows on a screen thereof updated information, such as the current position of the hydraulic excavator 1 and the position and posture of the working equipment 4 (in particular, the position of a blade edge of the bucket 8), in real time to help an operator operate the working equipment 4 of the hydraulic excavator 1. The position of the blade edge of the bucket 8 is calculated by a processor (not shown) using, for instance, current position information acquirable through a GNSS (Global Navigation Satellite System) antenna 3A provided to the hydraulic excavator 1 and/or vehicle-size information about the hydraulic excavator 1.

The hydraulic excavator 1 includes a controller (not shown) that compares the construction design data with the position of the blade edge of the bucket 8 in real time and controls the movement of the cylinders 6A, 7A, 8A based on the comparison result to control the movement of the working equipment 4. Specifically, while calculating a position of the bucket 8 relative to a spot where construction work is to be performed in accordance with the construction design data, the controller controls the working equipment 4 so as not to dig the ground deeper than a formation level based on the construction design data so that a predetermined construction work such as excavation and grading can be performed. During the construction work, the display 10 shows the position of the blade edge of the bucket 8, the construction design data and the like. Therefore, the working equipment 4 of the hydraulic excavator 1 can be automatically controlled based on the construction design data to help an operator operate the working equipment 4, so that a finishing stake (a mark for construction work), which is typically required for construction work, does not need to be arranged and thus construction efficiency can be improved.

Additionally, it is possible to achieve a construction result with high construction accuracy.

Description of Interior of Cab

As shown in FIG. 2, on the front side F of the right side R inside the cab 5, a multipurpose display 9 is provided on a holder extending upward from a deck of the cab 5, and a display 10 is attached to a pillar 5A (a frame of the cab 5) above the multipurpose display 9. The display 10 functions as a display according to the invention. The display 10 will be described later in detail. Incidentally, as long as an installation position for the display 10 is close to the operator's seat 91, the display 10 may be installed at a position different from one shown in FIG. 2. For instance, the display 10 may be installed on the pillar 5A on the left side.

The multipurpose display 9 corresponds to the display disclosed in Patent Literature 1 as described above. Specifically, the multipurpose display 9 shows information unrelated to computerized construction, such as an operating state and an indicator required for driving the hydraulic excavator 1. The types of information to be displayed include: an accumulated operation time of the hydraulic excavator 1; a setting of auto-deceleration; a setting of work mode; a setting of driving speed; an engine water temperature gauge for showing the temperature of a cooling water for the engine; a hydraulic oil temperature gauge for showing the temperature of a hydraulic oil for driving hydraulic devices such as the hydraulic cylinders; a fuel level gauge for showing the remaining amount of a fuel for driving the engine; an eco-gauge for showing fuel consumption; and a function switch menu for guiding a switch operation for setting a value of engine water temperature, a value of hydraulic oil temperature, a value of fuel consumption, various settings and the like.

The multipurpose display 9 also includes a function key (switch) for executing functions such as switching to a screen showing an image captured by an in-car camera (not shown) mounted on the counter weight, switching of display contents of the information such as the indicator and the operating state, and switching to a screen showing various maintenance histories. Further, the multipurpose display 9 includes a basic operation switch for executing auto-deceleration, selecting a work mode, selecting a driving gear, cancelling a buzzer, turning on a wiper, starting injection of a window washer, and setting an air conditioner.

The operator's seat 91 for an operator to be seated is substantially centered inside the cab 5. On the front side F of the operator's seat 91, a right and left pair of travel control levers 92, 92 used to control the undercarriage 2 are provided. On the left side L and the right side R of the operator's seat 91, working equipment control levers 93, 93 for controlling the swinging movement of the working equipment 4 (the boom 6, the arm 7 and the bucket 8) and the turning movement of the upper revolving body 3 are provided. On the right side R of the operator's seat 91, a console 94, which is provided with, for instance, a fuel dial for adjusting the amount of the fuel injected to the engine, is provided.

Description of Support Structure for Display

Figure 3:
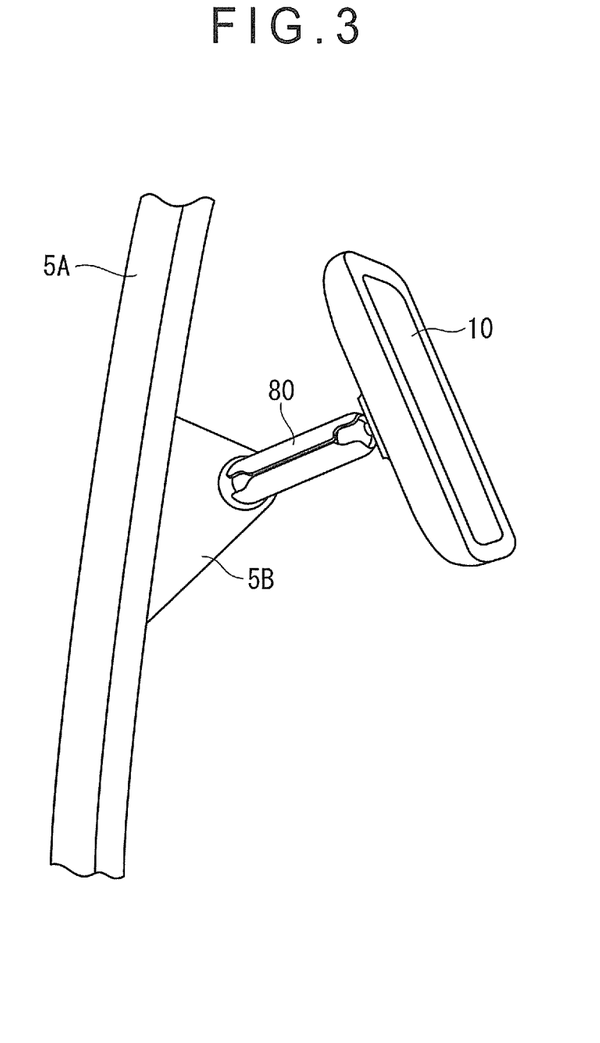
FIG. 3 is a side view showing a support structure for a display.
Figure 4:
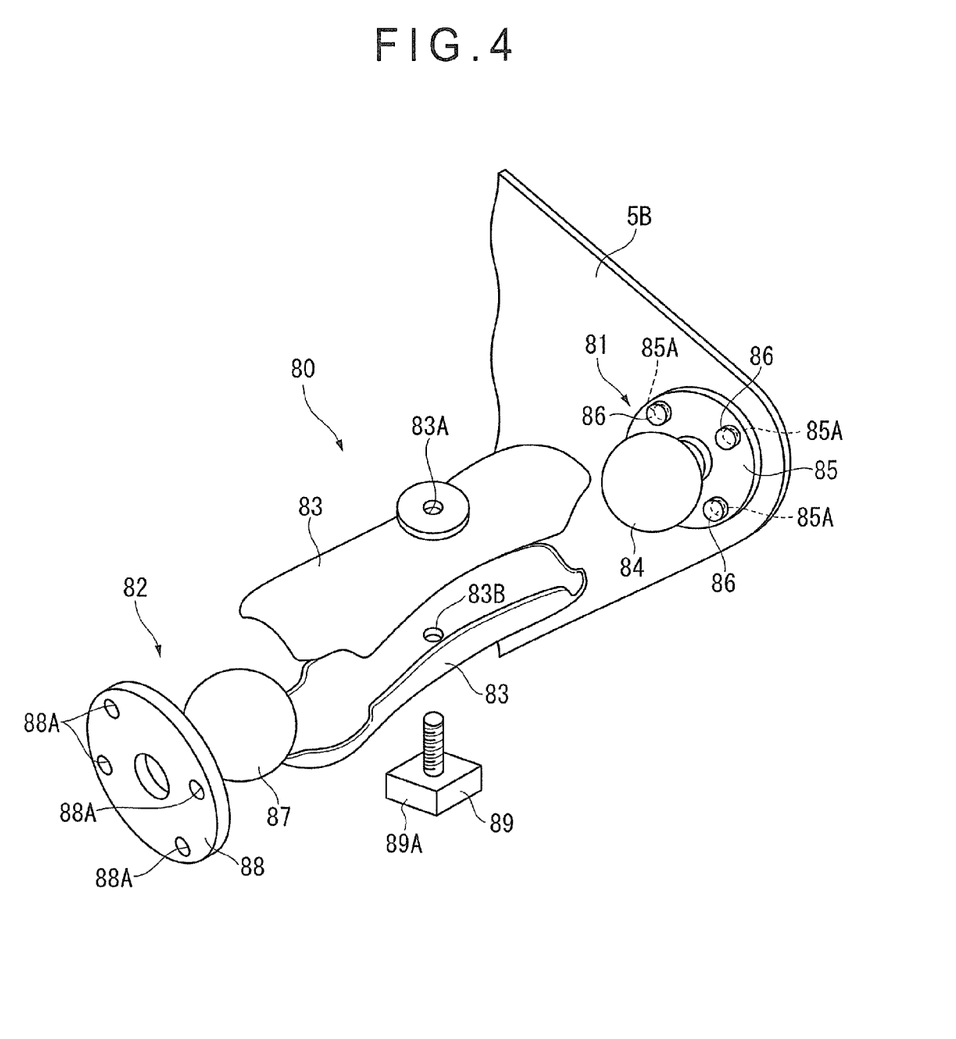
FIG. 4 is an exploded perspective view showing the support structure for the display.

FIG. 3 is a side view showing a support structure for the display 10 and FIG. 4 is an exploded perspective view showing a support 80 that supports the display 10.

As shown in FIGS. 3 and 4, the display 10 is supported by a support bracket 5B provided to the pillar 5A of the cab 5 via the support 80 in the form of a universal joint. The support bracket 5B is provided with a plurality of holes through which bolts 86 can be inserted, so that a base 81 can be fastened to the bracket 5B with the bolts 86.

The support 80 includes the base 81 attached to an inner surface of the support bracket 5B, a joint 82 attached to a rear surface of the display 10, and a pair of arms 83, 83 connecting the base 81 and the joint 82. It should be noted that the base 81, the joint 82 and the arms 83, 83 are made of metal and each have an exterior colored with a predetermined color. Spheres 84, 87 may be subjected to a surface treatment or the like to be hardened.

The base 81 includes the sphere 84 and a disc-shaped flat plate 85. The flat plate 85 is provided with a plurality of through holes 85A extending in a thickness direction of the flat plate 85. The bolts 86 are inserted through the through holes 85A to fasten the base 81 to the support bracket 5B. Incidentally, the base 81 and the support bracket 5B may be welded to each other instead of being fastened to each other with the bolts 86.

The joint 82, which is basically the same in structure as the base 81, includes the sphere 87 and a disc-shaped flat plate 88. The flat plate 88 is provided with a plurality of through holes 88A extending in a thickness direction of the flat plate 88. Stud bolts 23A (FIGS. 7 and 8) are inserted through the through holes 88A in a direction from the display 10 and nuts 23C (FIGS. 8 and 9) are screwed on the stud bolts 23A along with washers 23D, thereby fastening the joint 82 to the display 10.

The arms 83, 83 have first ends between which the sphere 84 of the base 81 is held and second ends between which the sphere 87 of the joint 82 is held. One of the arms 83 is provided with a bolt hole 83A. The other arm 83 is provided with a through hole 83B. The arms 83 are fastened into one piece using a fastening member 89 (e.g., a square bolt) that is screwed into the bolt hole 83A through the through hole 83B. It should be noted that the fastening member 89 has a square head in the form of a finger-grip portion 89A, which can be held with fingers to turn the fastening member 89, thereby adjusting a force for fastening the arms 83. Incidentally, the finger-grip portion 89A may be in the shape of a disc instead of a square shape and provided with a non-slip groove on a circumferential surface thereof.

Since the arms 83 are connected to the support bracket 5B via the sphere 84 of the base 81, the arms 83 are rotatable relative to the support bracket 5B. Therefore, the attachment angle of the support 80 relative to the support bracket 5B is freely adjustable.

Since the display 10 is connected to the arms 83 via the sphere 87 of the joint 82, the display 10 is rotatable relative to the support 80. Therefore, the attachment angle of the display 10 relative to an extending direction of the arms 83 is freely adjustable.

Specifically, when the arms 83 are firmly fastened to each other using the fastening member 89, the spheres 84, 87 of the base 81 and the joint 82 are each firmly held between the arms 83. The display 10 is thus fixed to the pillar 5A, on which the support bracket 5B is provided, and kept fixed.

On the other hand, when the arms 83 are loosely fastened to each other using the fastening member 89, the support 80 becomes rotatable relative to the support bracket 5B and the display 10 likewise becomes rotatable relative to the arms 83. The position and direction of the display 10 can thus be adjusted, thereby moving the display 10 relative to the pillar 5A within a movable range determined by the support 80.

As described above, the display 10 is fixed to the pillar 5A using the support 80 (a universal joint), the base 81 and the joint 82, so that the display 10 can be moved to adjust the position and direction of the display 10 as desired by an operator. For instance, an operator can move the display 10 to a position where the operator can easily look at the screen of the display 10. When the operator does not need to use the display 10 and wishes to look out ahead of the pillar 5A, the operator can move the display 10 to a position where the display 10 does not interfere with the operator's view toward the outside. The operator can also detach the display 10 from the arms 83 along with the joint 82 and take it with him or her.

Depending on the fastening force applied by the fastening member 89 as described above, the display 10 can be easily detached from the support 80. Therefore, the display 10 can be detached from the arms 83 along with the joint 82 and taken out, so that a necessary piece of information stored in a memory of the display 10 can be downloaded outside the construction site or new information can be uploaded to the memory. The display 10 includes a USB (Universal Serial Bus) connector 31 (described later). Information can thus be uploaded to/downloaded from the display 10 through a suitable input-output device.

Schematic Description of Display

Figure 5:
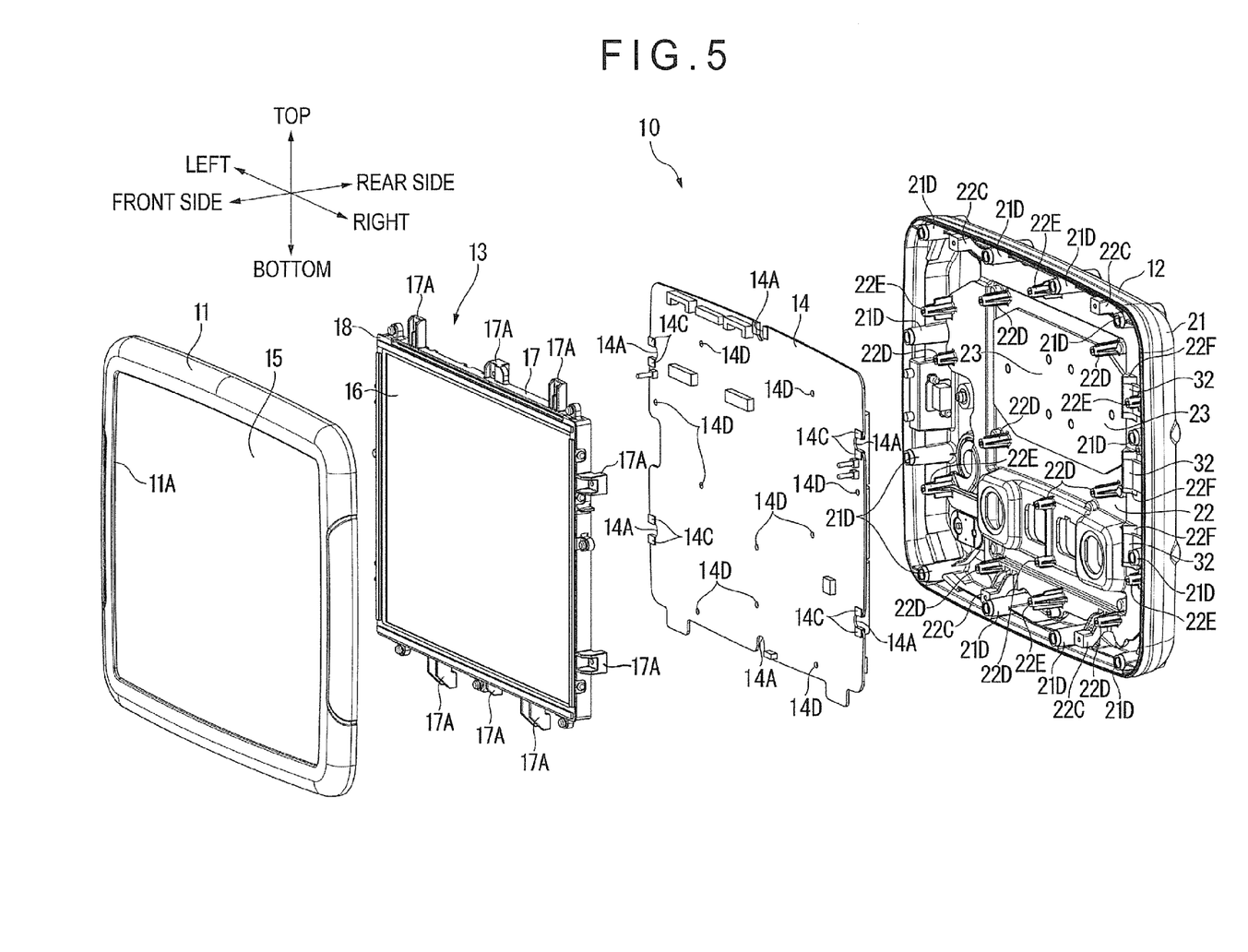
FIG. 5 is an exploded perspective view showing the display.
Figure 6:
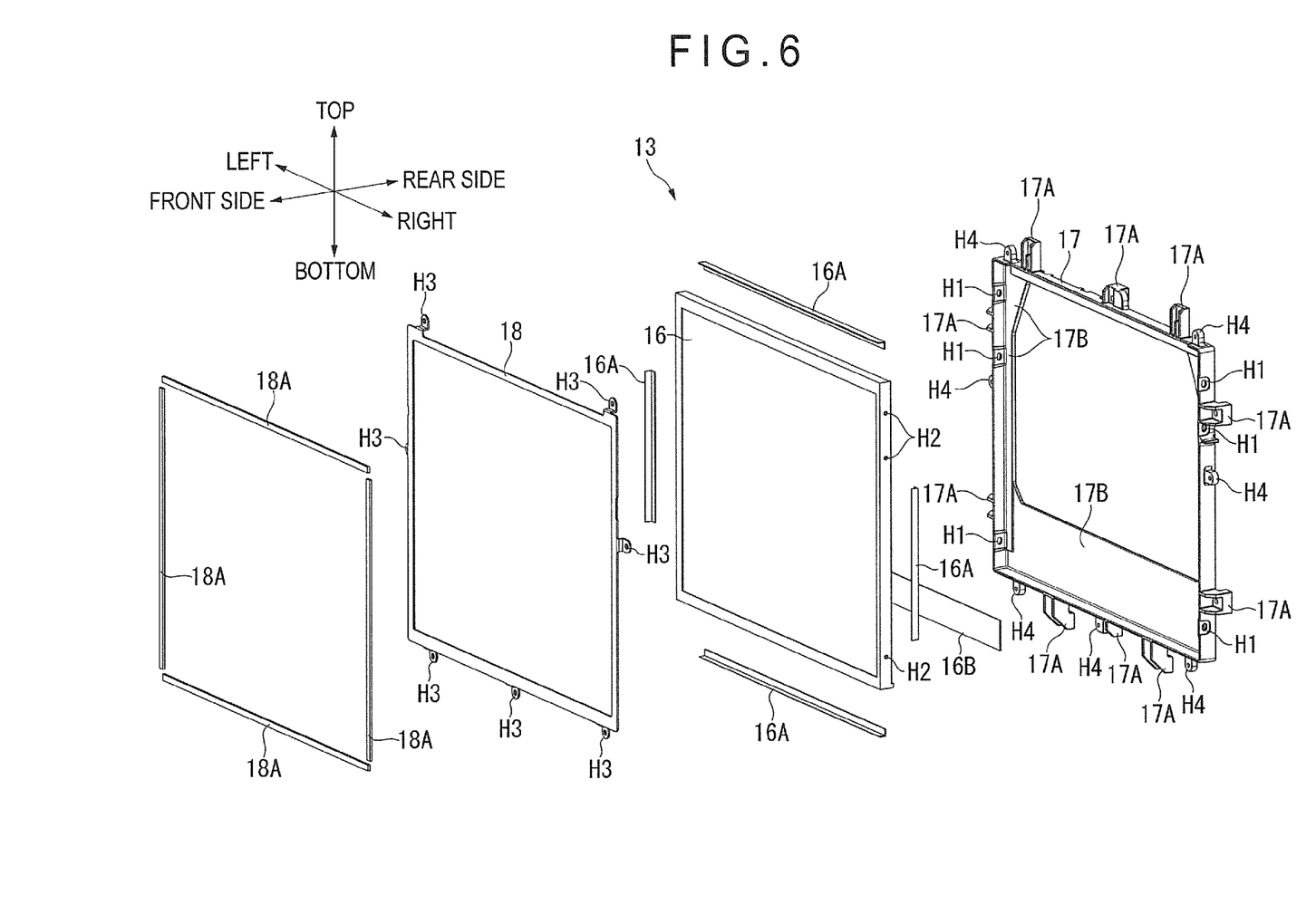
FIG. 6 is an exploded perspective view showing a display unit.
Figure 7:
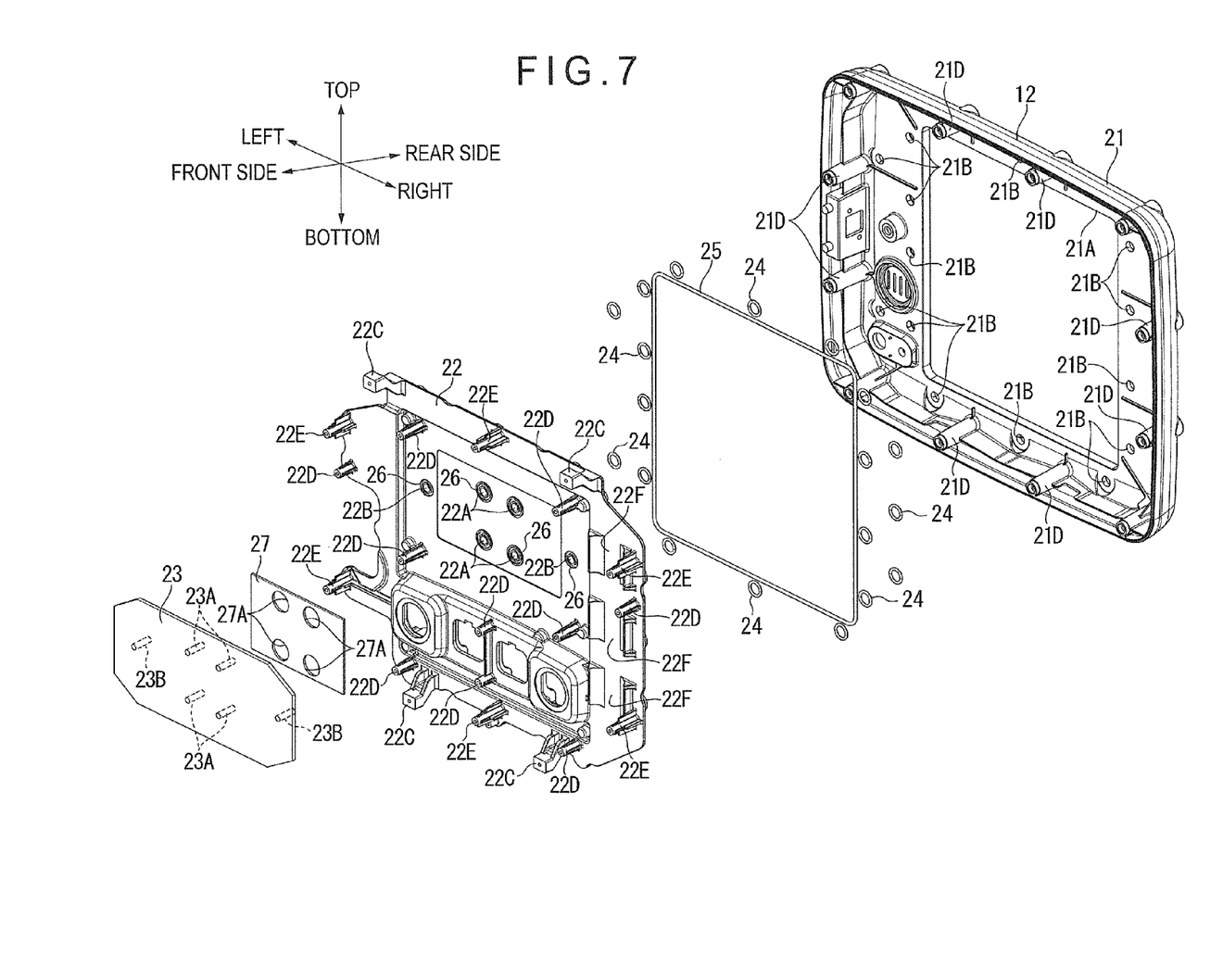
FIG. 7 is an exploded perspective view showing a rear case.

FIG. 5 is an exploded perspective view showing the display 10. FIG. 6 is an exploded perspective view showing a liquid crystal display 13. FIG. 7 is an exploded perspective view showing a rear case 12. A side of the display 10 where a front case 11 is provided is defined as the front side. When directions are mentioned below in the description, directions defined in the figures should be referred to.

As shown in FIG. 5, the display 10 includes: the front case 11 having a rectangular opening 11A at a center thereof; the rear case 12, for instance, screwed to the front case 11; the liquid crystal display 13 (display unit) housed in an inner housing space defined by the front case 11 and the rear case 12; and the control board 14 similarly housed in the inner housing space and located behind the liquid crystal display 13. The liquid crystal display 13 and the control board 14 are both fixed to the rear case 12. The rear case 12 will be described later in detail.

The front case 11 is made of a synthetic resin. For instance, the front case 11 is made of a material prepared by mixing polycarbonate and polybutylene terephthalate. An outer peripheral edge of the front case 11 is provided with a gasket (not shown), thereby providing a seal between the outer peripheral edge of the front case 11 and an outer peripheral edge of the rear case 12 to maintain the airtightness of the inner housing space.

The front case 11 is provided with the rectangular opening 11A. A panel 15 is attached to a rear surface of the front case 11 to close the opening 11A. The panel 15 is in the form of a touch panel such as a capacitance touch panel. The panel 15, which is made of a synthetic resin with a high visible-light transmittance, has a surface provided with a transparent conductive film of indium tin oxide so that the panel 15 functions as a touch panel.

As shown in FIGS. 5 and 6, the liquid crystal display 13 includes: a liquid crystal module 16; an aluminum holder 17 that is, for instance, frame-shaped and holds the liquid crystal module 16 from the rear side and the lateral sides (right and left sides); and a steel plate 18 that is, for instance, frame-shaped and presses the liquid crystal module 16 from the front side. The holder 17 and the plate 18 in combination function as a metal frame according to the invention.

The frame-shaped holder 17, which includes a receiving portion 17B, holds the liquid crystal module 16 from the rear side with a rear surface of the liquid crystal module 16 abutting against the receiving portion 17B via a shock-absorbing sheet 16B (described later). The holder 17 may be manufactured by die casting. The plate 18 may be manufactured by press-molding a laser-processed steel plate. In order to be usable for computerized construction, the display 10 (liquid crystal display 13) is required to show a lot of information to an operator with as good visibility as possible. Accordingly, for instance, a 12.1-inche color liquid crystal display is used as the liquid crystal display 13. However, since the liquid crystal display 13 has such a large size, the weight of the liquid crystal display 13 is increased.

Screws (not shown) are inserted through fixation holes H1 from the right and left sides of the holder 17 and then screwed into screw holes H2 provided to lateral surfaces of the liquid crystal module 16, thereby screwing the liquid crystal module 16 to be held in the holder 17. Further, screws (not shown) are inserted through fixation holes H3 provided to the plate 18 and then screwed into screw holes H4 provided to the holder 17, thereby screwing the liquid crystal module 16 to the holder 17 from the front side. In other words, the liquid crystal module 16 is held by the plate 18 not only from the right and left sides but also from the front side. Incidentally, without using the plate 18, the liquid crystal module 16 may be held only from the lateral sides only by screwing the screws (not shown) into the screw holes H2 provided to the lateral surfaces.

Shock-absorbing sheets 16A, 16B are respectively attached to the right and left and top and bottom surfaces and the rear surface (a surface on the rear side) of the liquid crystal module 16 to be interposed between the liquid crystal module 16 and an opposed surface of the holder 17 within a frame-shaped outline of the holder 17. Similarly, a shock-absorbing sheet 18A is attached to a front surface of the plate 18. A rubber material or a foam material may be used for the shock-absorbing sheets 16A, 16B, 18A.

A peripheral surface (i.e., top and bottom and right and left surfaces) of the holder 17 is provided with a plurality of arms 17A that protrude outward. The arms 17A are each provided with a through hole through which a screw (not shown) is inserted.

In this exemplary embodiment, projecting positions of some of the plurality of arms 17A (i.e., the right-and-left center one of three arms provided to each of the top and bottom surfaces and two arms provided to each of the right and left surfaces) are substantially aligned with an edge of the control board 14. Attachment bosses 22E (FIGS. 5 and 7) project from the rear case 12 at positions corresponding to these arms 17A. Ends of the attachment bosses 22E project toward the holder 17 (toward the front side) through cuts 14A provided to the control board 14. Later-described screws 17E (FIG. 10) are inserted through the through holes of the arms 17A to be screwed into screw holes provided to the attachment bosses 22E.

On the other hand, the rest of the arms 17A (i.e., the right and left two of three arms provided to each of the top and bottom) project further outward (in a top-and-bottom direction) from the edge of the control board 14 by a predetermined length. Screws (not shown) inserted through the through holes of the rest of the arms 17A are thus screwed into legs 22C (FIGS. 5 and 7) that are provided to the rear case 12 at positions distanced in the top-and-bottom direction from an outer edge position of the control board 14. In other words, the legs 22C are also provided with screw holes.

Figure 8:
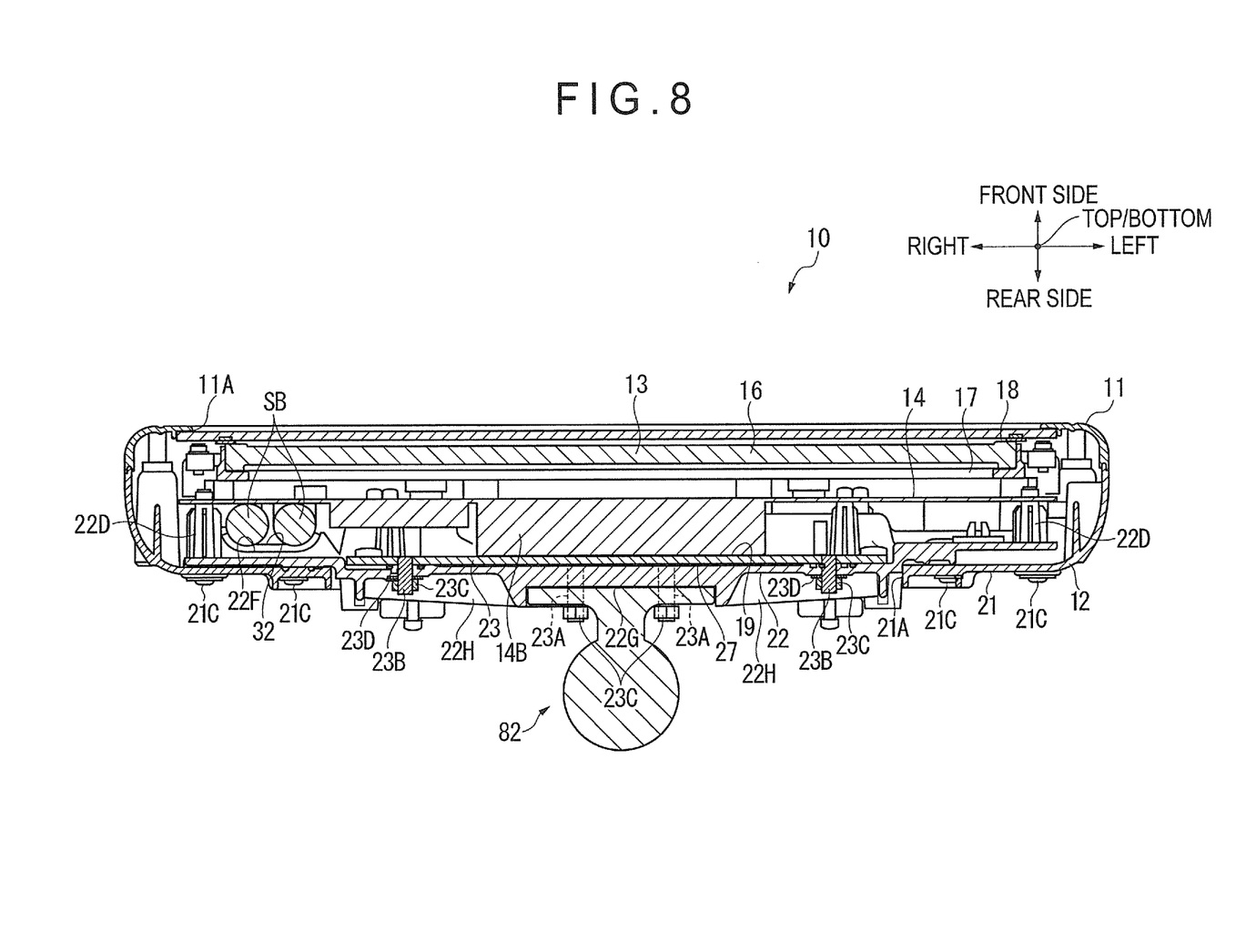
FIG. 8 is a sectional view showing the display, which is taken along a line A-A in FIG. 9.

The control board 14 is a circuit board on which electronic components and the like for performing a display control or the like on the liquid crystal display 13 are mounted. As shown in FIG. 8, on a rear surface (rear side) of the control board 14, an OS (Operating System) driver 14B that activates basic software used when the display 10 functions as a computer is provided. The OS driver 14B includes a numerical processor and generates heat during operation. Accordingly, a heat-radiation sheet (not shown) is attached to a surface of an electronic component of the OS driver 14B, such as the numerical processor. Further, an aluminum heat-radiation block is provided to be in contact with an upper surface (rear side) of the heat-radiation sheet. Therefore, the heat-radiation sheet and the heat-radiation block in combination function as a heat radiator. FIG. 8 shows that the electronic component such as the numerical processor, the heat-radiation sheet and the heat-radiation block, which are integrated into the OS driver 14B. Further, a heat-radiation sheet 19 is attached on a rear surface (a heat-radiation surface) of the heat radiator to function as a part of the heat radiator. The OS driver 14B and a metal plate 23 are in contact with each other via the heat-radiation sheet 19.

The control board 14 also includes a power supply unit, an interface unit that enables external signal transmission and reception, a processing unit that performs a necessary operation based on various types of information used for computerized construction, and a memory that stores the various types of information. Further, on the rear surface (rear side) of the control board 14, six secondary batteries SB in the form of AA-batteries (FIG. 8) are bonded with an adhesive or the like. These secondary batteries SB are used as a back-up power source for the display 10. As shown in FIG. 8 (a sectional view of the display 10), the secondary batteries SB are arranged in pairs in a right-and-left direction and the three pairs of secondary batteries SB are arranged in the top-and-bottom direction. The secondary batteries SB are mounted on the control board 14 as described above, so that the weight of the control board 14 is increased.

Description of Rear Case

Figure 9:
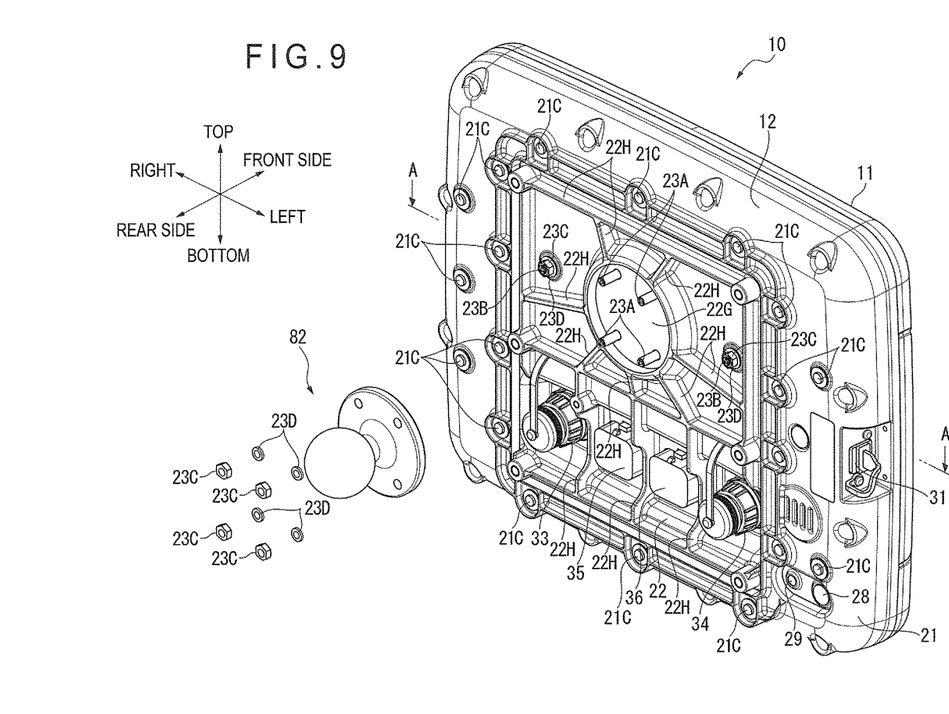
FIG. 9 is a perspective view of the display observed from a rear side.

FIG. 7 is an exploded perspective view showing the rear case 12. FIG. 8 is the sectional view showing the display 10, which is taken along a line A-A in FIG. 9. FIG. 9 is a perspective view of the display 10 observed from the rear side.

As shown in FIGS. 7 to 9, the rear case 12 includes: a resin case 21 made of the same material as that of the front case 11; a metal case 22 made of, for instance, aluminum and located inside the resin case 21; and a metal plate 23 made of, for instance, aluminum and located inside the metal case 22. The metal case 22 is manufactured by die casting and subjected to necessary machining processes for forming screw holes, polishing and the like. The metal plate 23 is cut out of an aluminum plate by, for instance, shirring and subjected to a necessary punching process.

The resin case 21 is provided with a rectangular opening 21A (FIG. 7). The metal case 22 is located inside the resin case 21 to close the opening 21A. A plurality of through holes 21B, which penetrate through the resin case 21, are provided around the opening 21A of the resin case 21. Screws 21C (FIGS. 8 and 9) are inserted through the through holes 21B from the outside (from the rear side) to be screwed into the metal case 22, thereby fastening the resin case 21 to the metal case 22.

Further, an annular groove (not shown) is provided to a rear surface of the metal case 22 (a surface opposed to the resin case 21) to surround each of portions where the screws 21C are screwed, and an O-ring 24 is provided in the groove. Additionally, a square gasket 25 is provided at a position corresponding to a periphery of the opening 21A of the metal case 22. The O-ring 24 and the gasket 25 thus seal a contact portion between the resin case 21 and the metal case 22 to maintain the air-tightness of the inner housing space.

Four relatively long stud bolts 23A (fixing unit) project from a rear surface of the metal plate 23 substantially at a center of the rear surface of the metal plate 23, and two stud bolts 23B, which are relatively short as compared with the stud bolts 23A, project from the rear surface of the metal plate 23 at both right and left of the stud bolts 23A in FIG. 7. The stud bolts 23A are used to fix the joint 82 of the support 80 to the display 10 and the nuts 23C are screwed onto the stud bolts 23A along with the washers 23D from the rear side of the metal case 22 (FIG. 9). The stud bolts 23B are used to fix the metal plate 23 to the metal case 22, and nuts and washers similar to the nuts 23C and the washers 23D are screwed onto the stud bolts 23B from the rear side of the metal case 22 at two positions (FIG. 9). Incidentally, the stud bolts 23A are not arranged to project directly from the metal case 22 for the following reason. When stud bolts are arranged to project directly from the metal case 22, which is manufactured by die casting, it is difficult to ensure a connection strength between the stud bolts and portions of the metal case 22 where the stud bolts project. Accordingly, the stud bolts 23A, 23B are arranged to project from a component different from the metal case 22, i.e., the metal plate 23.

The metal case 22 is provided with through holes 22A, 22B though which the stud bolts 23A, 23B of the metal plate 23 are respectively inserted (FIG. 7). An annular groove is provided to an inner surface of the metal case 22 (a surface opposed to the metal plate 23) to surround each of the through holes 22A, 22B and an O-ring 26 is provided in the groove. The O-ring 26 seals a contact portion between the metal case 22 and the metal plate 23 to maintain the air-tightness of the inner housing space.

Further, a heat-radiation sheet 27 with heat conductivity is interposed between the metal case 22 and the metal plate 23. The heat-radiation sheet 27 is likewise provided with through holes 27A through which the stud bolts 23A are inserted. The diameter of the through holes 27A is larger than the diameter of the grooves in which the O-rings 26 are provided, so that the through holes 27A do not hamper the sealing performance of the O-rings 26. A surface of the metal plate 23 on the front side is in contact with the above-described heat-radiation sheet 19. Due to the presence of the heat-radiation sheet 27, the heat generated by the OS driver 14B of the control board 14 is transmitted from the above-described heat radiator (i.e., the heat radiator including the heat-radiation sheet 19) through the metal plate 23 and the heat-radiation sheet 27 to the metal case 22 and radiated out of the display 10 through the rear surface of the metal case 22, so that the display 10 can be in a normal operation.

Detailed Description of Resin Case

An inner surface of the resin case 21 is provided with a plurality of attachment bosses 21D arranged along a periphery thereof as shown in FIGS. 7 to 9. The attachment bosses 21D each have a through hole through which a screw for fixing the front case 11 (not shown) is to be inserted, and the front case 11 is fastened by inserting the screw through the through hole of each of the attachment bosses 21D from the rear side to be screwed into a screw hole provided to the front case 11. Therefore, while the metal case 22 is fastened to the resin case 21, the resin front case 11, which is made of the same material as that of the resin case 21, is attached to the resin case 21.

In other words, the liquid crystal display 13 and the control board 14, each of which has a heavy weight, are fastened not to the resin case 21 but to the metal case 22 as described later. The front case 11, the liquid crystal display 13, the control board 14 and the resin case 21 are attached directly or indirectly to the metal case 22, which is attached to the joint 82. In other words, with such an arrangement, the display 10 is entirely supported by the support 80 via the metal case 22.

Additionally, a rear surface of the resin case 21 is also provided with an on/off switch 28 for power used to turn on or off the display 10 and an urgent-off switch 29 used to immediately turn off the display 10, and a lateral surface of the resin case 21 is provided with the USB (Universal Serial Bus) connector 31 and the like.

Detailed Description of Metal Case

The inner surface of the metal case 22 is provided with the legs 22C (four in total), which are arranged along top and bottom edges of the metal case 22 as shown in FIG. 5 or 7. The legs 22C, each having the screw hole, are fastened to ones of the arms 17A of the holder 17 of the liquid crystal display 13 that are arranged outside the edge of the control board (FIGS. 5 and 8). Specifically, the legs 22C are fastened to the right and left ones of the three arms 17A provided to each of the top and bottom of the holder 17. The inner surface of the metal case 22 is also provided with a plurality of relatively short attachment bosses 22D as well as the plurality of relatively long attachment bosses 22E. The attachment bosses 22E, each having the screw hole, are fastened to the rest of the arms 17A of the holder 17 with screws (not shown).

The control board 14 is brought against the relatively short attachment bosses 22D and fastened with screws (not shown) that are inserted through the through holes 14D of the control board 14 from the front side to be screwed into the screw holes of the attachment bosses 22D. When the control board 14 is fastened, the relatively long attachment bosses 22E project toward the front side at positions outside top and bottom and right and left edges of the control board 14. The rest of the arms 17A of the holder 17 are brought against the attachment bosses 22E and the liquid crystal display 13 is fastened with screws (not shown). In this manner, the liquid crystal display 13 and the control board 14, each of which has a relatively heavy weight, are attached to the metal case 22 via the legs 22C, the attachment bosses 22D and the attachment bosses 22E that are provided to the metal case 22.

The inner surface of the metal case 22 is also provided with battery holders 22F each holding two of the secondary batteries SB arranged side by side. A surface of each of the battery holders 22F is attached with a foamed resin shock-absorbing sheet 32 (FIG. 8). Due to the presence of the battery holders 22F and the shock-absorbing sheet 32, even when the hydraulic excavator 1 suffers large vibration or impact, the secondary batteries SB, which are bonded to the control board 14, is prevented from falling off and kept in an electrically connected state.

On the other hand, as shown in FIGS. 8 and 9, the rear surface of the metal case 22 includes a circular fixation surface 22G. The fixation surface 22G is provided with a plurality of through holes at positions corresponding to the stud bolts 23A. Therefore, the stud bolts 23A of the metal plate 23 project from the fixation surface 22G toward the rear side. The stud bolts 23A are inserted through the joint 82 and the joint 82 is fixed to the fixation surface 22G using the nuts 23C and the washers 23D. Specifically, the nuts 23C are fastened with the metal case 22 being held between the flat plate 88 of the joint 82 and the metal plate 23, thereby fixing the joint 82 to the fixation surface 22G.

As described above, while the liquid crystal display 13 and the control board 14 are fixed on the inner side (front side) of the metal case 22, the joint 82 is fixed on the rear side of the metal case 22. Therefore, as described above, the display 10, which includes heavy devices such as the liquid crystal display 13 and the control board 14, is entirely supported by the support 80 and thus by the pillar 5A via the metal case 22, which is excellent in strength and rigidity, so that the vibration resistance and the impact resistance of the display 10 can be ensured. In other words, the metal case 22 and the heavy devices (the liquid crystal display 13 and the control board 14) are integrated and supported by the pillar 5A.

As shown in FIG. 9, the rear surface of the metal case 22 is further provided with a plurality of ribs 22H, some of which radially extend from the fixation surface 22G. Not only do these ribs 22H ensure the strength of the metal case 22, but they ensure the heat-radiating performance of the metal case 22, so that heat transmitted from the control board 14 can be efficiently radiated outside.

The metal case 22 also includes a network connector 33 connected to a network cable, a USB connector 34, a power connector 35 connected to a power cable, and an interface connector 36 connected to a non-USB signal cable.

Support Structure for Control Board

Figure 10:
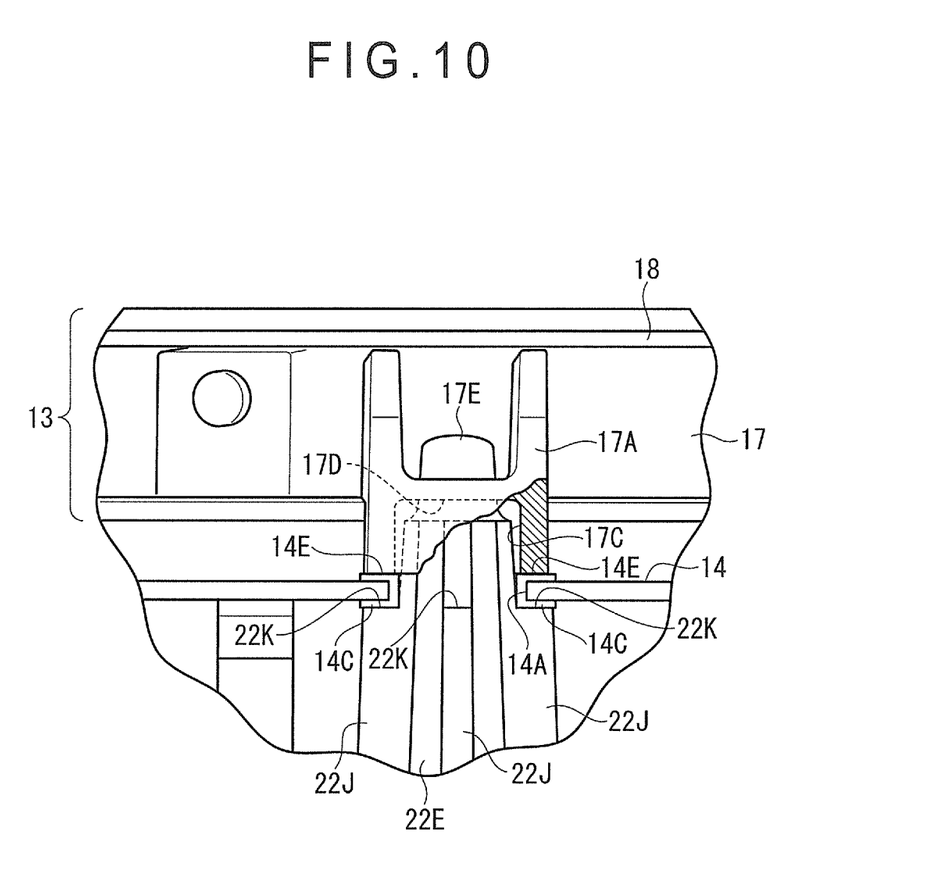
FIG. 10 is an enlarged view of a relevant part in the display.

FIG. 10 is an enlarged view showing a relevant part in the display 10 (i.e., a support structure) for supporting the holder 17, in which the liquid crystal display 13 is fitted, and the control board 14. The support structure includes the metal case 22.

As shown in FIG. 10, the arms 17A of the holder 17 are fixed to the attachment bosses 22E projecting from the metal case 22 using the screws 17E. The ends of the attachment bosses 22E project toward the holder 17 through the cuts 14A of the control board 14 as described above.

On the other hand, each of the arms 17A of the holder 17 is provided with a cap-shaped recess 17C at a portion where the screw 17E is inserted, the recess 17C opening toward the attachment boss 22E. An upper end of the attachment boss 22E is covered by the recess 17C. The upper end of the attachment boss 22E is brought into abutment against a ceiling 17D of the recess 17C, and the arm 17A is screwed with the upper end of the attachment boss 22E abutting against the ceiling 17D.

An outer circumferential surface of each of the attachment bosses 22E is provided with four linear ribs 22J extending in a projecting direction. An end of each of the ribs 22J is provided with a step 22K formed by cutting. An inner peripheral edge of the cut 14A of the control board 14 is set on the step 22K. The inner peripheral edge of the cut 14A is covered by a shock-absorbing sheet 14C located on both front and rear surfaces of the control board 14.

An open end of the recess 17C of each of the arms 17A (a lower end in FIG. 10) presses a pressed portion 14E of the shock-absorbing sheet 14C around the cut 14A of the control board 14. The control board 14 is thus held between the arm 17A and the step 22K of the attachment boss 22E along with the shock-absorbing sheet 14C. With this arrangement, even though a portion near the edge of the control board 14 suffers an unbalanced load due to the secondary batteries SB bonded thereto and thus the unstableness thereof due to vibration is increased, such a portion is reliably held by the arms 17A via the shock-absorbing sheet 14C and the vibration can be suppressed. Further, the metal case 22, the control board 14 and the holder 17 are integrated, thereby ensuring the vibration resistance and impact resistance of the display 10 as a whole.

In the above-described exemplary embodiment, since the display 10 is supported via the joint 82, the position and the direction of the display 10 are freely adjustable. Further, since the display 10 is supported at a single point by the joint 82, the display 10 can be easily attached/detached by increasing/reducing the fastening force of the arms 83.

Moreover, the liquid crystal display 13 and the control board 14 of the display 10 (heavy devices) are attached to the metal case 22, which is excellent in strength and rigidity, and the metal case 22 is supported by the pillar 5A via the support 80 including the joint 82 while being integrated with the control board 14 and the holder 17. Therefore, a connected portion between the joint 82 and the display 10 can be prevented from being damaged by vibration or impact applied during the operation of the hydraulic excavator 1. Further, the fastening force for fastening the liquid crystal display 13 and the control board 14 can be reliably ensured in the display 10, thereby ensuring the vibration resistance and impact resistance of the display 10. Moreover, since the components of the display 10 that are required to have strength and rigidity are made of metal as described above while the front case 11 and the resin case 21 of the display 10 are made of resin, the portability of display 10 is ensured without excessively increasing the weight of the display 10 while the display 10 has a good appearance.

Incidentally, it should be understood that the scope of the invention is not limited to the above-described exemplary embodiment but includes modifications and improvements as long as the modifications and improvements are compatible with the invention.

For instance, in the exemplary embodiment, the display 10 is fixed to the pillar 5A via the support 80 including the base 81, the joint 82 and the arms 83. However, this arrangement is not requisite for the invention. For instance, while the base 81 is fixed to a frame such as the pillar 5A, the metal case 22 of the display 10 may be provided with a holding member that detachably holds the base 81. In this case, the base 81 and the holding member in combination function as the universal joint according to the invention to enable attachment/detachment of the display 10.

To the contrary, the joint 82 may be provided to the metal case 22 while the holding member is fixed to the frame. In this case, the holding member and the joint 82 in combination function as the universal joint according to the invention to enable attachment/detachment of the display 10. In either case, since the universal joint is used, the direction of the display 10 is adjustable.

In the exemplary embodiment, a liquid crystal display is described as an example of the display according to the invention display but it is not requisite. Examples of the display according to the invention may include a plasma display, an LED (Light-Emitting Diode) display and an EL (Electroluminescence Display) in addition to a liquid crystal display.

In the exemplary embodiment, the display 10 usable for computerized construction is described as an example of the display according to the invention, but a display such as the multipurpose display 9 may be used in place of the display according to the invention.

In the exemplary embodiment, the display 10 is provided to the hydraulic excavator 1, but the display according to the invention may be provided to construction machines such as a bulldozer, a motor grader and an asphalt finisher.

The invention claimed is:

1. A display for a construction machine, the display comprising:
    a front case;
    a rear case comprising an opening and attached to the front case, wherein the front case and the rear case define an inner housing space;
    a metal case that is configured to be detachably supported on a construction machine frame via a universal joint and that is bonded to a portion around the opening provided in the rear case;
    a display unit that is attached to the rear case so as to be housed inside the inner housing space;
    a control board that is attached to the rear case so as to be housed inside the inner housing space and that is configured to perform a display control on the display unit;
    a first heat-radiation sheet attached to the control board;
    a metal plate in contact with the first heat-radiation sheet;
    a second heat-radiation sheet interposed between the metal case and the metal plate;
    an attachment bolt provided on the metal plate, wherein the attachment bolt is configured to be used for attaching the universal joint and to penetrate through a first through hole provided on the second heat-radiation sheet and a second through hole provided on the metal case to provide a fixing unit projected on a back side of the metal case; and
    a plurality of ribs provided around the fixing unit on the metal case,
    wherein the universal joint is configured to be fixed on the fixing unit.

2. The display according to claim 1, further comprising a resin case that is attached to the metal case to provide the rear case in combination with the metal case, wherein the front case is made of a resin and is attached to the rear case.

3. The display according to claim 1, wherein the plurality of ribs radially extend on the metal case.

4. The display according to claim 1, wherein the display unit is a liquid crystal display, and the liquid crystal display comprises:
    a liquid crystal module; and
    a metal frame that is configured to hold the liquid crystal module at least from a lateral side of the liquid crystal module.

5. The display according to claim 1, wherein the construction machine is a hydraulic excavator,
    wherein the display further comprises a resin case that is attached to the metal case to provide the rear case in combination with the metal case, wherein the front case is made of a resin and is attached to the rear case to define the inner housing space in which the display unit and the control board are housed,
    wherein the display unit is a liquid crystal display, and the liquid crystal display comprises:
    a liquid crystal module; and
    a metal frame that is configured to hold the liquid crystal module from a rear side, a lateral side and a front side of the liquid crystal module, and
    wherein the liquid crystal display is located near an operator's seat of the hydraulic excavator.

6. A construction machine comprising the display according to claim 1.

* * * * *